United States Patent
Mallick et al.

(10) Patent No.: US 8,871,656 B2
(45) Date of Patent: Oct. 28, 2014

(54) FLOWABLE FILMS USING ALTERNATIVE SILICON PRECURSORS

(71) Applicant: Applied Materials, Inc., Santa Clara, CA (US)

(72) Inventors: Abhijit Basu Mallick, Palo Alto, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/765,328

(22) Filed: Feb. 12, 2013

(65) Prior Publication Data

US 2014/0051264 A1 Feb. 20, 2014

Related U.S. Application Data

(60) Provisional application No. 61/606,805, filed on Mar. 5, 2012.

(51) Int. Cl.
*H01L 21/02* (2006.01)
*H01L 21/762* (2006.01)

(52) U.S. Cl.
CPC ...... *H01L 21/0217* (2013.01); *H01L 21/02293* (2013.01); *H01L 21/02326* (2013.01); *H01L 21/02164* (2013.01); *H01L 21/02274* (2013.01); *H01L 21/02337* (2013.01); *H01L 21/76224* (2013.01)
USPC ...... 438/791; 438/787; 257/E21.24

(58) Field of Classification Search
None
See application file for complete search history.

(56) References Cited

U.S. PATENT DOCUMENTS

| | | | |
|---|---|---|---|
| 7,541,297 B2 | 6/2009 | Mallick et al. | |
| 7,867,923 B2 | 1/2011 | Mallick et al. | |
| 2007/0281106 A1 | 12/2007 | Lubomirsky et al. | |
| 2009/0104755 A1* | 4/2009 | Mallick et al. | 438/477 |

OTHER PUBLICATIONS

Ingle et al., U.S. Appl. No. 60/803,493, "Chemical Vapor Deposition of High Quality Flow-Like Silicon Dioxide Using a Silicon Containing Precursor and Atomic Oxygen," filed May 30, 2006.
Mallick et al., U.S. Appl. No. 61/606,805, "Flowable Films Using Alternative Silicon Precursors," filed Mar. 5, 2012.
PCT/US13/25934, "Flowable Films Using Alternative Silicon Precursors," filed Feb. 13, 2013.

* cited by examiner

*Primary Examiner* — Zandra Smith
*Assistant Examiner* — Pamela E Perkins
(74) *Attorney, Agent, or Firm* — Kilpatrick Townsend & Stockton LLP

(57) ABSTRACT

Methods of depositing initially flowable dielectric films on substrates are described. The methods include introducing silicon-containing precursor to a deposition chamber that contains the substrate. The methods further include generating at least one excited precursor, such as radical nitrogen or oxygen precursor, with a remote plasma system located outside the deposition chamber. The excited precursor is also introduced to the deposition chamber, where it reacts with the silicon-containing precursor in a reaction zone deposits the initially flowable film on the substrate. The flowable film may be treated in, for example, a steam environment to form a silicon oxide film.

9 Claims, 8 Drawing Sheets

FLOWABLE FILMS USING ALTERNATIVE SILICON PRECURSORS

CROSS-REFERENCES TO RELATED APPLICATIONS

This application claims the benefit of U.S. Prov. Pat. App. No. 61/606,805, filed Mar. 5, 2012, and titled "Flowable Films Using Alternative Silicon Precursors," which is related to co-assigned U.S. Pat. No. 7,867,923 by Mallick et al, and titled "HIGH QUALITY SILICON OXIDE FILMS BY REMOTE PLASMA CVD FROM DISILANE PRECURSORS", filed Oct. 22, 2007; and U.S. Patent Application No. 60/803,493 by Ingle et al, and titled "CHEMICAL VAPOR DEPOSITION OF HIGH QUALITY FLOW-LIKE SILICON DIOXIDE USING A SILICON CONTAINING PRECURSOR AND ATOMIC OXYGEN", filed on May 30, 2006. This application is also related to co-assigned U.S. Pat. No. 7,541,297 by Mallick et al, and titled "METHOD AND SYSTEM FOR IMPROVING DIELECTRIC FILM QUALITY FOR VOID FREE GAP FILL", also filed Oct. 22, 2007. The entire contents of the above provisional application and related applications is hereby incorporated by reference for all purposes.

BACKGROUND OF THE INVENTION

Gap and trenches such as shallow trench isolation structures (STIs) are commonly employed to electrically isolate elements on semiconductor devices. An STI may include a trench or gap formed in an isolation region of a semiconductor substrate that is filled with a dielectric material to hinder the electrical coupling of nearby device structures (e.g., transistors, diodes, etc.). As the device density on integrated circuits continues to increase, the size and distance between device structures is decreasing. However, the vertical heights of the STIs normally do not decrease as fast as their horizontal widths, resulting in gaps and trenches with larger ratios of height to width (i.e., higher aspect ratios).

While the ability to make device structures with increasing aspect ratios allows more of the structures (e.g., transistors, capacitors, diodes, etc.) to be packed onto the same surface area of a semiconductor chip substrate, it has also created fabrication problems. One of these problems is the difficulty of completely filling the gaps and trenches in these structures without creating a void or seam during the filling process. Filling gaps and trenches with dielectric materials like silicon oxide is necessary to electrically isolate nearby device structures from each other to minimize electrical noise and current leakage. As aspect ratios increase, it becomes more difficult to fill deep narrow trenches without creating a void or seam in the dielectric material that fills the trench.

Voids and seams in a dielectric layer cause problems both during semiconductor device fabrication and in the finished devices. The voids and seams are formed randomly in the dielectric material and have unpredictable sizes, shapes, locations and densities. This results in unpredictable and inconsistent post-deposition processing of the layer, such as uneven etching, polishing, annealing, etc. The voids and seams in the finished devices also create variations in the dielectric qualities of gaps and trenches in device structures. This can result in erratic and inferior device performance due to electrical crosstalk, charge leakage, and in some instances, shorting within the device, among other problems.

Techniques have been developed to minimize the formation of voids and seams during deposition of dielectric materials on high aspect ratio structures. These include slowing the deposition rate of the dielectric material so it stays more conformal to the sidewalls and bottom of the trench. A more conformal deposition can reduce material build up at the top of the trench and the chance of dielectric material prematurely sealing off the top of the trench to form a void (a problem sometimes referred to as "breadloafing"). Unfortunately however, slowing the deposition rate also means increasing the deposition time, which reduces processing efficiency and production rates.

Another technique to control void formation is to increase the flowability of the deposited dielectric material. A material with more flowability can more quickly fill a void or seam and prevent it from becoming a permanent defect in the fill volume. For example, highly flowable spin-on-glass (SOG) precursors like PSZ films, SAM 24, BTBAS, etc., were conventionally employed for filling trenches with good conformality. However, increasing the flowability of an silicon oxide dielectric material by such conventional SOG films often results in an as-deposited films with low film density caused by residual carbon and silanol groups. One approach to increased film densification is to use high-temperature annealing when curing the SOG film into a silicon oxide film. However, the high-temperature annealing used to remove residual carbon and OH groups may also cause a considerable degree of volumetric shrinkage of film. In narrow trenches for STI applications, the as-deposited films are constrained and unstable to shrink, resulting low density films with porous or void containing structures.

Thus, there remains a need for improved processes for increasing the density of the dielectric films in the trenches, gaps, and other device structures with high aspect ratios to achieve void-free gapfills. There also remains a need for dielectric deposition processes that can deposit dielectric materials at high rates and good flowability characteristics without adversely affecting the quality of the finished gapfill. These and other aspects of dielectric film deposition are addressed by the present invention.

BRIEF SUMMARY OF THE INVENTION

This invention relates to a method of forming silicon oxide film for manufacturing a semiconductor device. Embodiments include methods of forming a flowable dielectric film that include the chemical vapor deposition (CVD) of silicon-and-nitrogen-containing material (e.g., films having Si—N(H)—Si bonds) formed from a silicon-containing precursor that reacts with a radical nitrogen precursor (e.g., —N, —NH, —NH$_2$) generated in a remote plasma. The deposited film is cured to convert the silicon-and-nitrogen-containing material to silicon oxide (e.g., Si—O—Si), increasing film densification during a post-deposition anneal (e.g., a steam anneal). The methods can be applied in forming high quality silicon oxide films for STI (Shallow Trench Isolation) structures, but it will be recognized that they have wider applicability.

Embodiments also include methods of depositing a silicon-and-nitrogen-containing material on a substrate. The methods may include the steps of introducing a silicon-containing precursor to a deposition chamber that contains the substrate. The silicon-containing precursor. The method may also include generating at least one radical nitrogen precursor with a remote plasma system located outside the deposition chamber. Additionally, the method may include introducing the radical nitrogen precursor to the deposition chamber where the radical nitrogen and silicon-containing precursors react and deposit the silicon and nitrogen containing film on the substrate.

Embodiments may further include methods of forming a silicon oxide film on a substrate. The methods may include providing a substrate in a deposition chamber and generating activated nitrogen species (e.g., hydronitrene radicals) with a remote plasma system coupled to the deposition chamber. Additionally, the method includes introducing silicon-containing precursor to a deposition chamber. The method further includes introducing the activated nitrogen species to the deposition chamber, where they react with the silicon-containing precursors and deposit a first film on the substrate. The first film may be a silicon-and-nitrogen-containing film (e.g., a film having a plurality of Si—N(H)—Si bonds). Moreover, the method includes annealing the first film in a vapor atmosphere and forming a second film on the substrate. The second film may replace at least a portion of the nitrogen with oxygen to form, for example, a plurality of Si—O—Si bonds.

Additional embodiments and features are set forth in part in the description that follows, and in part will become apparent to those skilled in the art upon examination of the specification or may be learned by practice of the invention. The features and advantages of the invention may be realized and attained by means of the instrumentalities, combinations, and methods described in the specification.

DETAILED DESCRIPTION OF THE INVENTION

Methods are described for forming dielectric materials such as silicon oxide, on a substrate as part of the manufacture of a semiconductor device. Embodiments include chemical vapor deposition methods of forming a flowable dielectric film that includes silicon and nitrogen (e.g., films with Si—N(H)—Si bonds) from the reaction of a silicon precursor with a radical nitrogen precursor (e.g., —N, —NH, —NH$_2$) formed in a remote plasma. The methods may also include curing the flowable dielectric film to convert the silicon-and-nitrogen-containing material into silicon oxide materials with post-deposition annealing (e.g., steam annealing). Among other applications, the methods may be used to form high quality silicon oxide gapfills (e.g., the formation of STI structures).

The silicon precursor may include a carbon free precursor that has both silicon and nitrogen atoms. Some examples of silicon-and-nitrogen-containing precursors of this type include:

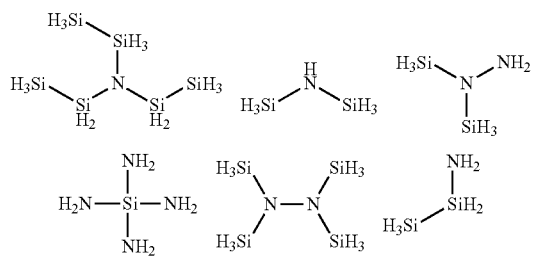

Additional silicon-and-nitrogen-containing precursors may also include carbon. Some examples of this type of precursor include:

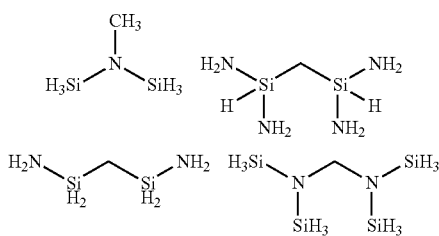

In still additional examples, the silicon-and-nitrogen-containing precursor may have a cyclic component. Cyclic precursors may be selected to reduce the number of additional elements (e.g., hydrogen atoms) that accompany the silicon and nitrogen. They may also be selected for their lower bond breaking energies to create reactive species under less energetic conditions in a reaction zone. Some examples of this type of precursor include:

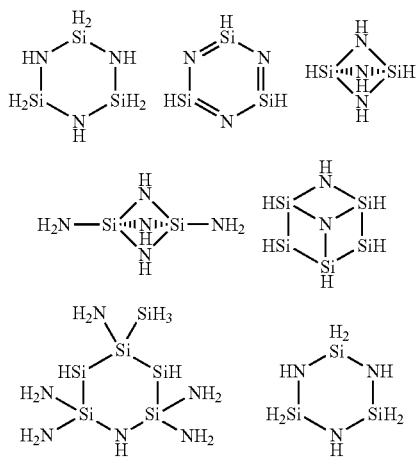

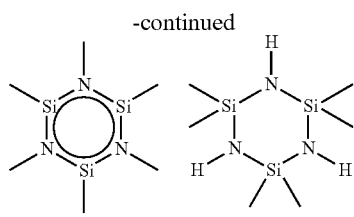

Exemplary silicon precursors may also be nitrogen-free and rely on the radical nitrogen reactant to provide the nitrogen component to the initially-flowable dielectric film. In some examples, the silicon precursors may include carbon, as shown below:

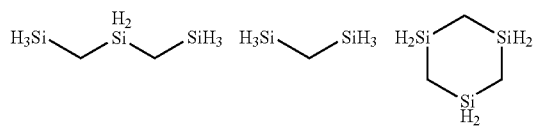

In additional examples, the silicon precursor may also be carbon-free, such as:

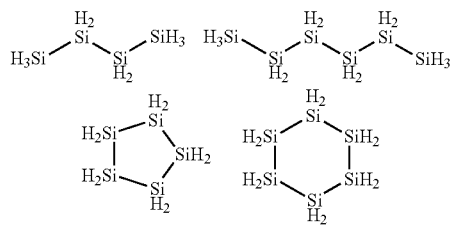

The silicon precursor, and/or a starting reactant used to make the precursor, may include a halogen (i.e., fluorine, chlorine, bromine, and/or iodine group). Exemplary halogen-containing silicon precursors may include:

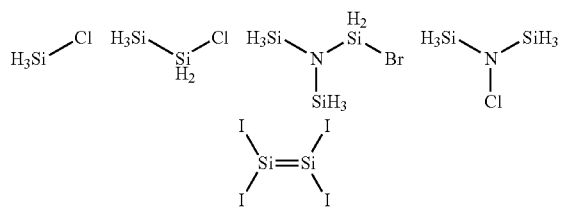

The silicon precursor may also contain oxygen. The oxygen may function as a bridge between two moieties (e.g., between two silicon groups, between a silicon group and a carbon group, etc.) or it may be part of a terminal moiety (e.g., —OH, —COOH, —NCO, etc.) Exemplary oxygen-containing silicon precursors include:

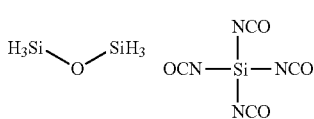

Figure 1:
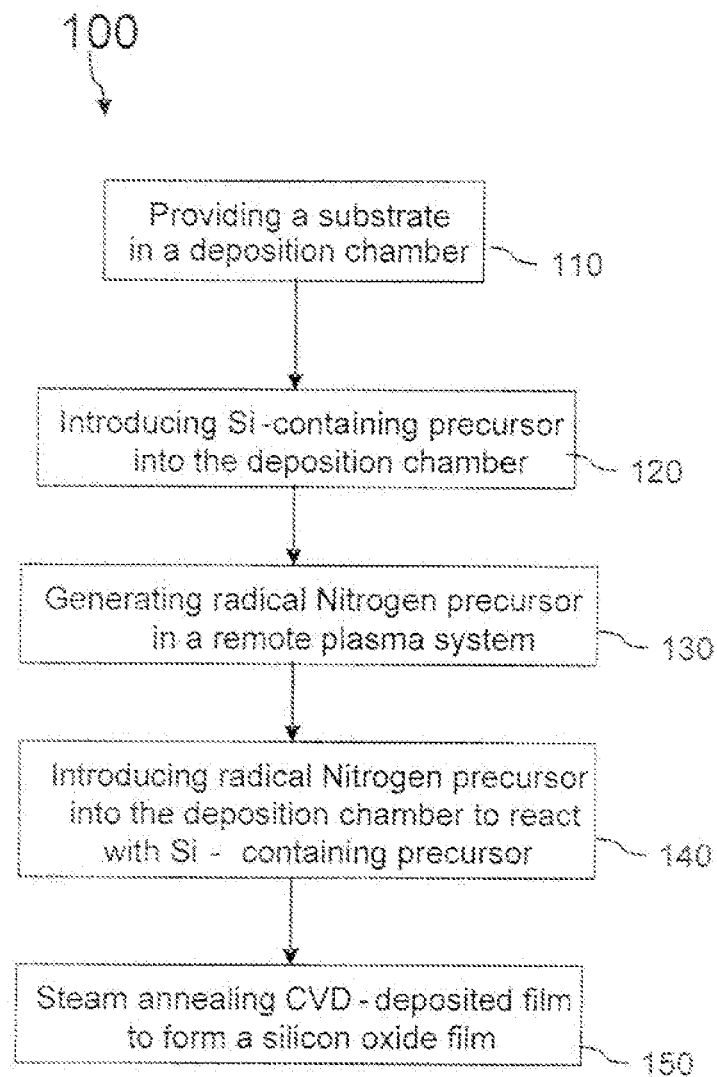
FIG. 1 shows schematically a chemical reaction process of reacting Si—Si bonds in silicon precursors with reactive nitrogen species to form Si—N(H)—Si containing compounds, and then oxidizing the compounds into Si—O—Si containing compounds according to embodiments of the present invention.

FIG. 1 is a simplified flowchart highlighting selected steps in a method 100 of forming a silicon oxide film on a substrate according to embodiments of the invention. The method forms silicon oxide by first depositing a flowable film on the substrate and then converting the flowable film into the oxide. Exemplary method 100 includes a non-exhaustive series of steps to which additional steps (not shown) may also be added. One of ordinary skill in the art would recognize many variations, modifications, and alternatives.

In the embodiment shown, the method starts with providing a substrate in a deposition chamber (110). The method introduces a silicon-containing precursor to the deposition chamber (120). The silicon-containing precursor may include one or more of the silicon compounds described above as well as other silicon-containing compounds. The method also includes generating one or more excited nitrogen precursors (130). The excited nitrogen precursor may be, for example, a radical nitrogen precursor generated in a remote ammonia plasma system coupled to the deposition chamber.

The excited nitrogen precursor may be introduced into the deposition chamber to react with the silicon-containing precursor and deposit a flowable silicon-and-nitrogen-containing dielectric film on the substrate (140). The excited nitrogen precursor may be introduced to the deposition chamber coincidently and independently from the silicon-containing precursor. For example, the excited nitrogen precursor may be generated in a remote plasma unit and transported to the deposition chamber through a separate flow channel in a dual-zone showerhead from the silicon-containing precursor. The two precursors may first make contact and react in a reaction zone of the deposition chamber that may be located proximate to the substrate.

The method may also include a post-deposition treatment of the initially flowable deposited film (150). The treatment may include steam annealing to oxidize the flowable dielectric film into a silicon oxide film. For some flowable films, steam oxidation may include a film expansion due, for example, to the conversion of Si—N(H)—Si bonds to Si—O—Si bonds that may counteract film shrinkage due, for example, to the removal of some hydroxyl groups from the CVD-deposited film. When the expansion and shrinkage pressures are more balanced during post-deposition treatment, a dense silicon oxide film may be formed with fewer stress cracks.

The initially deposited, flowable dielectric film tends to flow to the bottom portion of gaps and trenches in the substrate instead of sticking to the top portion. The flowable characteristics of the deposited films reduce the formation of voids around the center of the gapfill or STI trench that are caused when the depositing film prematurely closes off the top portion.

The CVD deposition process described in method 100 reacts a silicon-containing precursor with an excited nitrogen precursor to form the flowable film. It should be appreciated that additional methods may be used to form the flowable film depending on the selection of the silicon-containing precursor and the excited precursor. For example, co-assigned U.S. Patent Application No. 60/803,493 by Ingle et al, filed at May 30, 2006 and titled "CHEMICAL VAPOR DEPOSITION OF HIGH QUALITY FLOW-LIKE SILICON DIOXIDE USING A SILICON CONTAINING PRECURSOR AND ATOMIC OXYGEN," (the entire contents of which is herein incorporated by reference for all purposes) uses an excited oxygen precursor instead of excited nitrogen. Excited oxygen precursors may also be used with select silicon-containing precursors, particularly silicon-containing precursors that also include carbon. The reaction of the silicon-containing precursors with the excited oxygen (e.g., radical oxygen atoms generated in a remote plasma unit) may produce an initially flowable dielectric film that can be subsequently treated to from silicon oxide.

As noted above, reactive nitrogen species (such as —N, —NH, and —NH$_2$) used in method 200 may be generated by introducing ammonia (NH$_3$) in a remote plasma system. The remote plasma system may include a separate chamber that is coupled to the deposition chamber. The plasma conditions used to decompose the ammonia to NH/N/H radicals may include: use RF power in a range of 3 kW to 15 kW to generate the plasma under a chamber pressure ranging from 1 Torr to 10 Torr at a chamber temperature ranging from room temperature to about 200° C. The decomposition of ammonia in the remote plasma system produces radical nitrogen precursors, such as hydronitrene radicals like NH or NH$_2$. Atomic hydrogen (H) radicals may also be generated. For example, hydronitrene and hydrogen radicals are generated in step 230 of the method 200.

Figure 2:
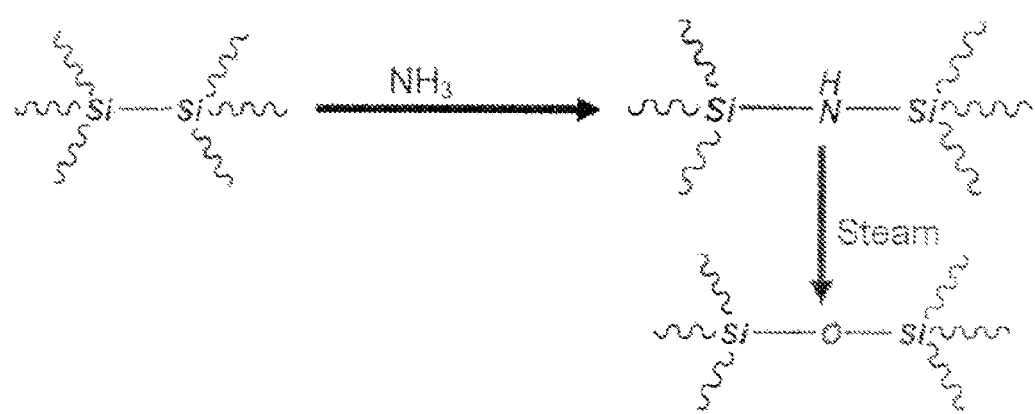
FIG. 2 is a simplified flow chart illustrating a method of forming a silicon oxide film on a substrate according to embodiments of the present invention.

FIG. 2 shows one exemplary chemical reaction process of reacting a silicon precursor having an Si—Si bond with a radical nitrogen precursor to initially deposit a silicon-and-nitrogen-containing film having Si—N(H)—Si bonds. The initial film in then exposed to an oxygen-containing environment that converts the Si—N(H)—Si bonds into Si—O—Si bonds. The diagram of FIG. 2 is merely an example of a chemical reaction process, which should not unduly limit the scope of the claims herein. One of ordinary skill in the art would recognize other variations, modifications, and alternative silicon precursors to form an initially flowable film that converts into a non-flowable dielectric material such as silicon oxide.

As shown, the chemical reaction is a CVD (Chemical Vapor Deposition) process during which a silicon containing precursor with at least a Si—Si bond is mixed with a radical nitrogen species generated from the decomposition of ammonia in a remote plasma (i.e., a plasma formed separately from the deposition of the flowable Si—N(H)—Si film). The CVD process leads to conversion of Si—Si bonds in the silicon precursor (or precursors) to Si—N(H)—Si bonds. The Si—N(H)—Si bonds are then converted to Si—O—Si bonds during a subsequent annealing step, where the annealing may be done in, for example, a steam (i.e., H$_2$O vapor) environment. Because oxygen atoms have a larger atomic volume than nitrogen atoms, the formation of silicon oxide during the anneal may result in the expansion of the dielectric film.

The above CVD process introduces a silicon-containing precursor into the deposition chamber to provide at least a portion of a silicon component of the dielectric material. Exemplary silicon containing reactants may include one or more of the above-described silicon-containing compounds that have at least one Si—Si bond. Additional silicon-containing precursors may include Alkoxy Disilanes, Alkoxy-Alkyl Disilanes, Alkoxy-Acetoxy Disilanes, and Polysilanes. For example, the Alkoxy Disilanes include Si$_2$(EtO)$_6$ Ethoxy Disilanes, Si$_2$(MeO)$_6$ Methoxy Disilanes, and Si$_6$(MeO)$_{12}$ Methoxy Cyclohexylsilanes, where Et denotes Ethyl group (C$_2$H$_6$) and Me denotes Methyl group (CH$_3$). In another example, the Alkoxy-Alkyl Disilanes may include Si$_2$(EtO)$_4$(Me)$_2$ Tetraethoxy-Dimethyl Disilanes, Si$_2$(EtO)$_4$(EO$_2$ Tetraethoxy-Diethyl Disilanes, Si$_2$(EtO)$_2$(Me)$_4$ Diethoxy-Tetramethyl Disilanes, Si$_2$(MeO)$_4$(Me)$_2$ Tetramethoxy-Dimethyl Disilanes, and Si$_4$O$_2$(Me)$_8$ Methyl Cyclohexylsiloxanes, Si$_6$(MeO)$_6$(Me)$_6$Methoxy-Methyl Cyclohexylsiloxanes, Si$_4$O$_2$(H$_2$)$_4$ Hydro-Cyclohexylsiloxanes. In yet another example, the Alkoxy-Acetoxy Disilanes may include Si$_2$(AcO)$_6$ Acetoxy Disilanes, Si$_2$(Me)$_4$(AcO)$_2$ Tetramethyl-Diacetoxy Disilanes, and Si$_2$(Me)$_2$(AcO)$_4$ Dimethyl-Tetracetoxy Disilanes, where Ac denotes Acetyl group. And in yet still another example, the polysilanes include cyclopentylsilanes or other substitutes. The Si-containing precursor may avoid reacting or even contacting other reactants before reaching the deposition chamber, and in some instances before reaching a precursor reaction zone inside the deposition chamber.

The silicon-containing precursor may react with an excited nitrogen-containing species to form the flowable film. The excited nitrogen-containing species (e.g., a radical nitrogen species) may be generated from remote ammonia plasma. For example, the radical nitrogen species may include nitrogen ions, hydronitrene radicals NH$_x$, where x=1, or 2. Because in the silicon-containing precursor has at least a Si—Si bond which is highly reactive, the CVD process results in a flowable film containing Si—N(H)—Si bonds. The film may also contain oxygen and carbon species that were present in the precursors. For example, when the silicon-containing precursor includes carbon, the precursors may react to deposit a flowable silicon carbonitride film on the substrate. The carbon may contribute to the flowability of the deposited film. Similarly, oxygen moieties present in the precursors may form hydroxyl (—OH) groups in the deposited film that contribute to its flowability.

In yet another embodiment, the subsequent thermal treatment within a water vapor environment induces another chemical reaction between the deposited silicon-and-nitrogen-containing film and the H$_2$O vapor. This reaction is an oxidization process in which the Si—N(H)—Si bond is converted into Si—O—Si bond, resulting a formation of an silicon oxide film. One side product may include NH$_3$ ammonia which can be immediately pumped out through an exhaust system built for the chamber.

Figure 3:
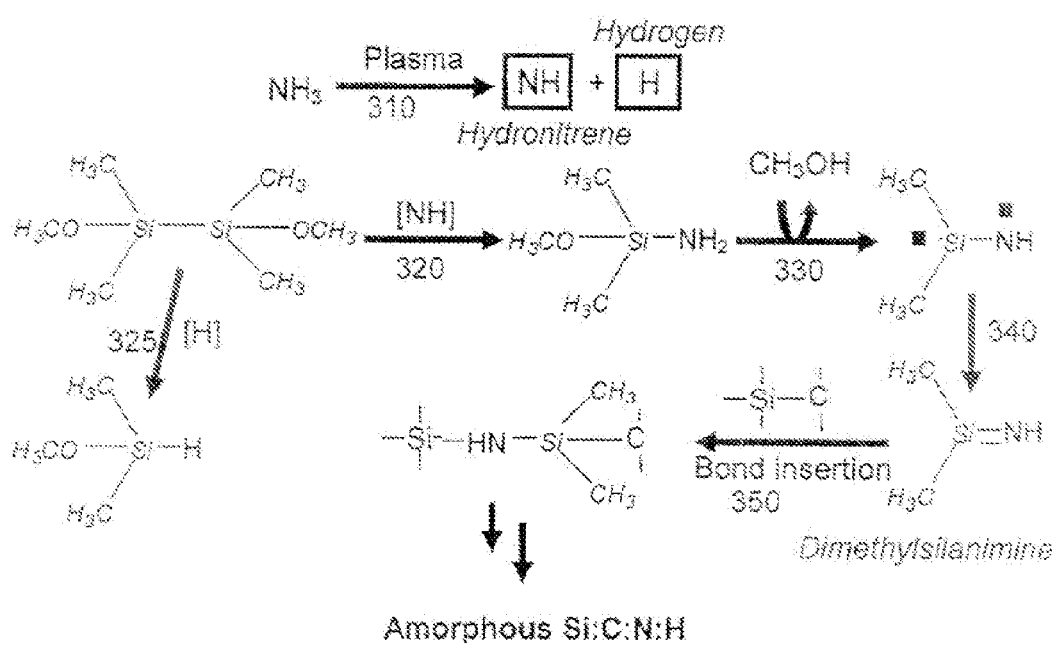
FIG. 3 shows schematically chemical reaction steps for forming silicon carbonitride Si:C:N:H from disilane or polysilane precursors and radical nitrogen precursors generated by the decomposition of ammonia in a remote plasma according to embodiments of the invention.

FIG. 3 shows schematically chemical reaction steps for forming a silicon carbonitride (Si:C:N:H) film from the reaction of disilane and/or polysilane precursors with radical nitrogen precursors generated by ammonia remote plasma according to embodiments of the invention. FIG. 3 is one illustrative example and should not unduly limit the scope of the claims herein. One of ordinary skill in the art would recognize other variations, modifications, and alternatives.

As shown, hydronitrene NH radicals and hydrogen H radicals are generated in the process 310 by ammonia plasma. When the hydronitrene NH radicals and hydrogen H radicals meet the disilanes or polysilanes precursors in the deposition chamber, the highly reactive Si—Si bonds in disilanes or polysilanes precursors are usually broken apart to form a silicon-hydroxyl radical re-bonded with —NH$_2$, as shown in a reaction process 320 of FIG. 3. Alternatively, the Si—Si bonds in disilanes or polysilanes precursors may be broken to form a silicon-hydroxyl radical re-bonded directly with —H, as shown in a side process 325 of FIG. 3. Of course, one of skilled in the art would recognize many alternatives, variations, and modifications.

In the example shown, a silicon-hydroxyl group bonded with a —NH$_2$ radical may decompose to a silicon-hydronitrene radical by releasing an alcohol group. For example, the hydroxyl group in the original silicon containing precursors captures a H atom that bonds to the nitrogen atom to form methanol (CH$_3$OH), as shown in the process 330 of FIG. 3. The methanol produced can be easily removed by a vacuum pump to drive the formation of additional methanol. The remaining portion of the reactant becomes a radical containing a Si—NH bond with two dangling bonds. Subsequently, the two dangling bonds may quickly re-bond to form a dimethylsilanimine radical with a Si=NH double bond, as illustrated in the process 340 of FIG. 3. Of course, one of skilled in the art would recognize many alternatives, variations, and modifications.

In another example, the chemical reaction may further involve a reaction between the dimethylsilanimine radical and a Si—C bond existing in the silicon containing precursor. As shown in the process 350 of FIG. 3, the reaction is a bond insertion process in which the dimethylsilanimine radical is directly inserted in between the Si atom and C atom to create a silicon carbonitride product. Of course, one of skilled in the art would recognize many alternatives, variations, and modifications.

Figure 4:
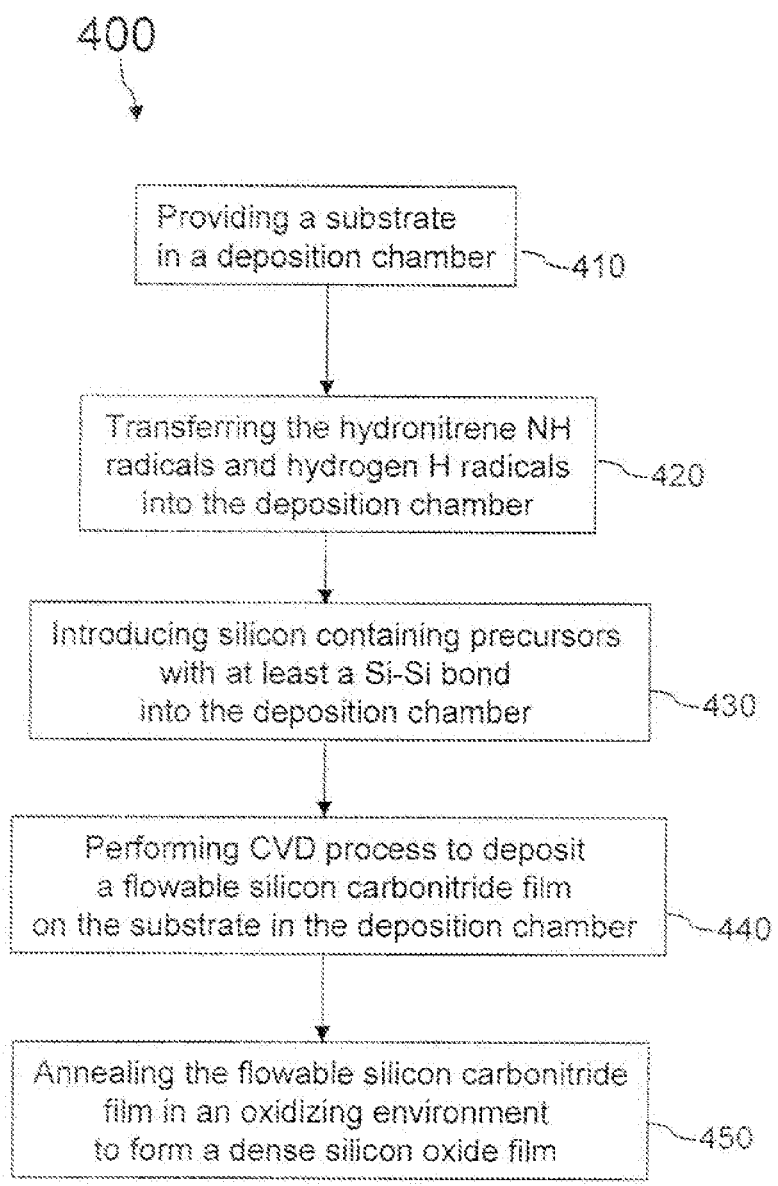
FIG. 4 is a simplified flow chart illustrating a method of depositing a flowable silicon and nitrogen containing film according to embodiments of the invention.

FIG. 4 is a simplified flow chart illustrating a method of depositing a flowable silicon and nitrogen containing film according to embodiments of the invention. This diagram is merely an example and should not unduly limit the scope of the claims herein. One of ordinary skill in the art would recognize other variations, modifications, and alternatives. As shown, the method 400 is a CVD process for depositing an amorphous silicon carbonitride film with a flow-like characteristic on a substrate. The method 400 may include providing a substrate in a deposition chamber (410). The deposition chamber is coupled to a remote plasma system. The method 400 may also include introducing ammonia into the remote plasma system to produce a radical nitrogen precursor from the decomposition of ammonia in the remote plasma. The radical nitrogen precursors produced may include hydronitrene NH radicals and hydrogen H radicals. Of course, there can be other alternatives, variations, and modifications.

Additionally, the method 400 includes transferring the hydronitrene NH radicals and hydrogen H radicals into the deposition chamber (420). In one embodiment, the hydronitrene NH radicals and hydrogen H radicals is transferred through a showerhead that fluidly couples the deposition chamber to the remote plasma system. For example, the reactive nitrogen radicals (and accompanying carrier gases) may enter the deposition chamber through a baffle or showerhead like the one shown in co-assigned U.S. patent application Ser. No. 11/754,924 by Lubomirsky et al, filed May 29, 2007, and titled "PROCESS CHAMBER FOR DIELECTRIC GAP-FILL," the entire contents of which are herein incorporated by reference for all purposes.

The method 400 also includes introducing one or more silicon containing precursors with at least a Si—Si bond into the deposition chamber (430). In one embodiment, the silicon containing precursors are directed into the deposition chamber independently. For example, these precursors are from one or more separate CVD gas sources and are not met with any ammonia plasma before being introducing into the deposition chamber. In another embodiment, the silicon containing precursors include disilanes having a single Si—Si units in their molecular frameworks and/or polysilanes having multiple Si—Si units. For example, the silicon containing precursors are disilanes with ethyl hydroxyl groups as shown in FIG. 3.

The method 400 further includes performing a CVD process to deposit a flowable silicon carbonitride film on the substrate in the deposition chamber (440). As the silicon containing precursors meet with the hydronitrene NH radicals and hydrogen H radicals in the deposition chamber, the Si—Si bonds in the precursors are highly reactive so that the disilane or polysilane precursors with Si—Si bond(s) will break into silicon-hydronitrene radicals. Furthermore, the silicon-hydronitrene radicals, after an alcohol decomposing and rebonding reactive process, may turn into a dimethylsilanimine radicals. The dimethylsilanimine radicals then may react with Si—C bonds in the precursors by a bond insertion process to form silicon carbonitride molecules.

For example, the CVD process 440 may be performed in a deposition chamber under the following process conditions: 1) Precursor flow rate is set in a range of 1 m gm/min to 15 gm/min; 2) Deposition chamber is held a pressure of about 1 mTorr to about 600 Torr range; 3) Chamber temperature is controlled between about 0° C. to about 400° C. The formation of the silicon-hydronitrene radicals takes place during the process 320 of FIG. 3. Additional chemical reaction processes involved in the above CVD process 440 may include the reaction steps 330, 340, and 350 shown in FIG. 3. The resulting silicon carbonitride molecules are then deposited onto the substrate to form a solid film. The film is amorphous in nature and has flow-like characteristics with hydroxyl groups in the molecular framework.

The flowable deposited film forms a void-free gapfill that has very low density for device dielectric isolation. The method 400 may further include annealing the flowable silicon carbonitride film in an oxidizing environment to form a dense silicon oxide film (450). Similar to other flowable dielectric films, such as a conventional SOG film, the high-temperature annealing causes the hydroxyl groups and residual carbon to decompose into water and/or alcohol vapors which are immediately pumped out, resulting in significant film shrinkage and densification. In a specific embodiment, the annealing process 450 is a thermal annealing in an oxidizing environment within a steam (water vapor) atmosphere. For example, the steam annealing can be performed at a substrate temperature from about 200° C. up to about 1050° C. The water vapor pressure during annealing is about a range from 1 Torr to 1 atm (i.e., about 760 Torr).

In an alternative embodiment, the annealing process 450 is an ozone treatment with substrate held at room temperature up to about 600° C. The ozone treatment may further be incorporated with a UV light irradiation. In another alternative embodiment, the annealing process 450 is a film curing process involving molecular oxygen treatment from room temperature to about 900° C. or atomic oxygen treatment from room temperature up to about 600° C. Of course, one of skilled in the art would recognize many alternatives, variations, and modifications.

In another specific embodiment, due to the existence of the Si—N(H)—Si bonds formed in the as-deposited silicon carbonitride film, the oxidizing process 450 will cause conversion of these Si—N(H)—Si bonds to Si—O—Si bonds. Because the bigger atomic volume of oxygen than nitrogen, this conversion inherently expands the film. For example, the bond conversion process is the same as the chemical reaction process described in FIG. 1. This film expansion counteracts the film shrinkage due to the loss of unreacted carbon and OH species. The net effect of balancing the film expansion and shrinkage results in a higher quality silicon oxide film with less overall shrinkage, but with increased film density while retaining void-free gap filling.

Figure 5:
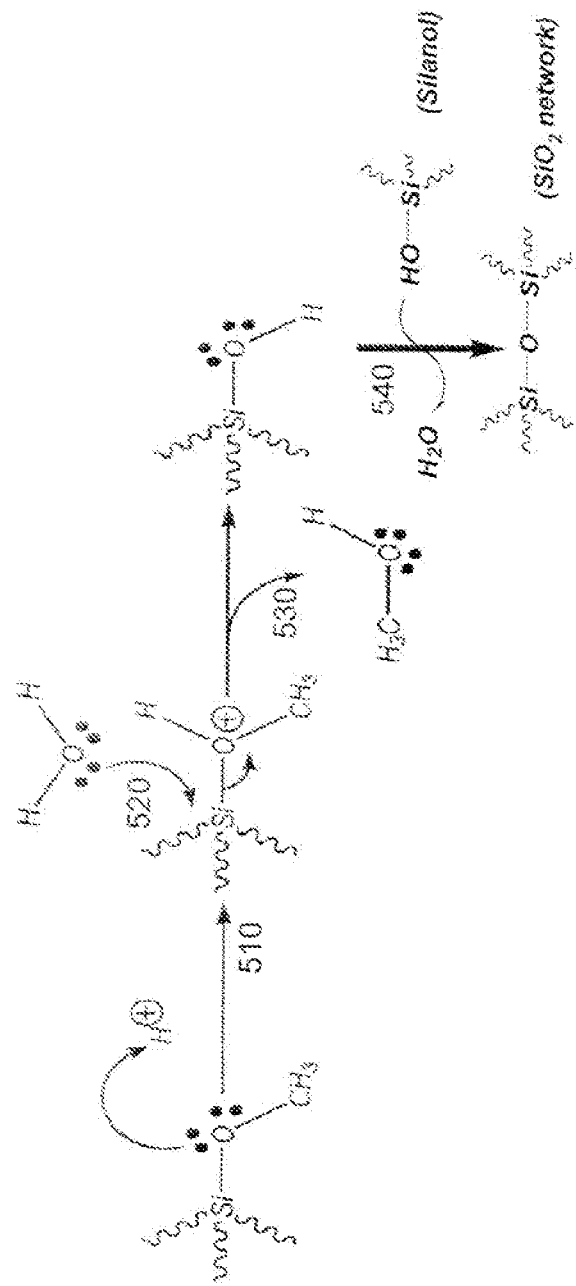
FIG. 5 shows schematically a chemical reaction mechanism for acid catalyzed removal of carbon-based species in an as-deposited dielectric film according to embodiments of the invention.

In another embodiment, annealing the flowable silicon carbonitride film is performed in an atmosphere that includes both water vapor and acid vapor. For the CVD-deposited film involving alkoxy substituted disilanes, an acid environment may help to catalyze the reaction of the organic moieties that are un-reacted during deposition. FIG. 5 shows schematically a chemical drawing of acid catalysis to treat the as-deposited dielectric film according to an embodiment of the present invention. This diagram is merely an example and should not unduly limit the scope of the claims herein. One of ordinary skill in the art would recognize other variations, modifications, and alternatives. As shown, with an acidic vapor added during the annealing an unreacted hydroxyl group can experience an electrophilic attack of acid, i.e., an $H^+$ ion from the acid may turn an unreacted $CH_3O$ group into an reactive $CH_3OH$ group by taking one electron from the oxygen atom to the hydrogen atom. This is illustrated in the process 510 of FIG. 5.

The water vapor then may react with the reactive $CH_3OH$ group, as shown in process 520. The reaction results in the formation of silanol Si—OH group and the release of alcohol $CH_3OH$ molecule from the film. The condensation of the formed silanol Si—OH groups (i.e., by releasing the water when combining two silanol Si—OH group) leads to the formation of silicon oxide networks in the film. In one embodiment, the annealing with acid treatment help to increase the film density by removal of carbon species and reduce the possibility of void formation through the loss of the hydroxyl groups through other manner. Of course, there can be other alternatives, variations, and modifications.

In additional embodiments, annealing the flowable silicon carbonitride film is performed in an atmosphere that includes both water vapor and a basic vapor such as ammonia ($NH_3$). For the CVD-deposited film involving alkoxy substituted disilanes, the basic environment may help to catalyze the reaction of the organic moieties that are un-reacted during deposition.

Figure 6A:
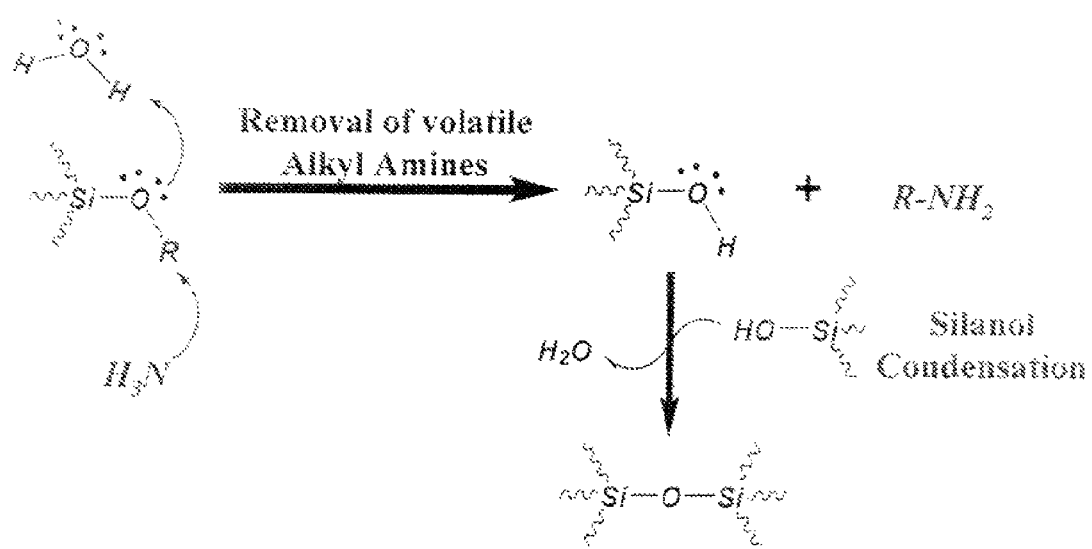
FIGS. 6A-B show chemical reaction mechanisms for base catalyzed removal of carbon-based species in an as-deposited dielectric film according to embodiments of the invention.
Figure 6B:
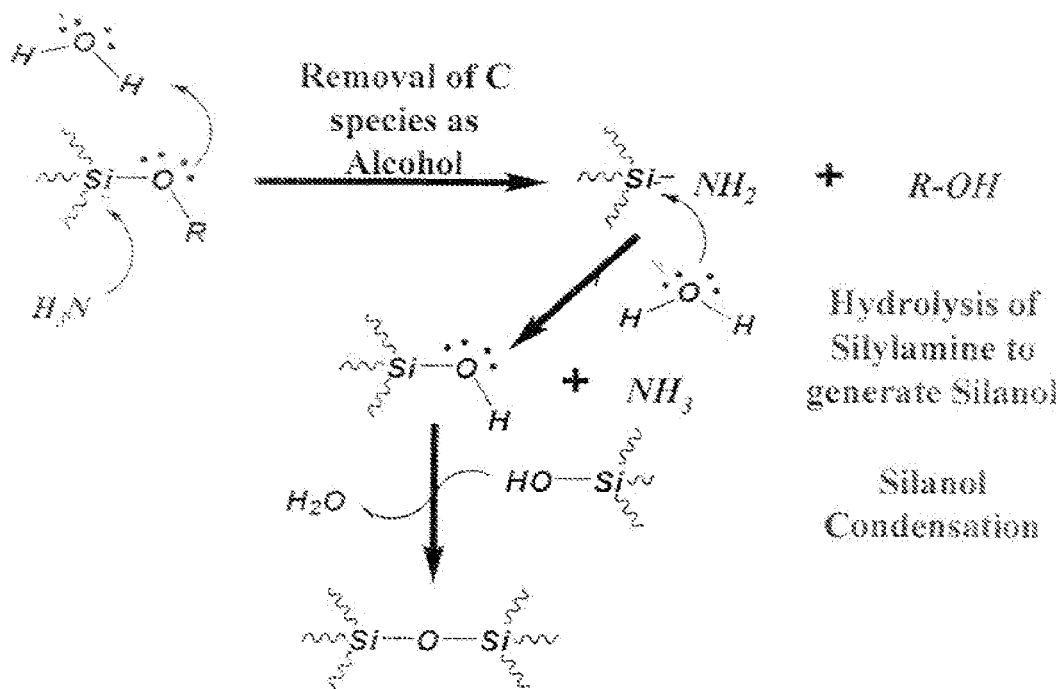

FIGS. 6A-B show schematically two chemical reaction mechanisms for base catalyzed treatment of as-deposited dielectric film. The first mechanism shown in FIG. 6A includes a nucleophilic attack of an alkyl group by a basic vapor that includes ammonia. In this mechanism, the alkyl portion of a silicon alkoxide group transfers to the ammonia, which also releases a proton ($H^+$) during the transfer. As the transfer of the alkyl group also involves a water molecule, which donates a proton to replace the alkyl group that is leaving and forming a silanol (—Si—OH) group. In subsequent reactions, a silanol condensation reaction may occur to convert the —Si—OH group into a —Si—O—Si— group in the cured dielectric oxide film.

The second reaction mechanism shown in FIG. 6B includes a nucleophilic attack of the silicon atom in a silicon alkoxide with a basic vapor that include ammonia. The reaction includes a substitution of the alkoxide group attached to the silicon with the ammonia molecule to form a silyl amine. The alkoxide group reacts with a proton donated from a water molecule to form an alcohol. In subsequent reactions, the silyl amine may be hydrolyzed to form a silanol and regenerate the ammonia. Then, similar to the mechanism described in FIG. 6A, the silanol group may undergo a condensation reaction that converts the —Si—OH group into a —Si—O—Si— group in the cured dielectric oxide film.

It should be appreciated that the base catalyzed reaction mechanisms described in FIGS. 6A-B are but two examples of possible reaction mechanisms, and should not unduly limit the scope of the claims herein. One of ordinary skill in the art would recognize other variations, modifications, and alternatives for base catalyzed treatment of as-deposited silicon alkoxide species.

Exemplary process conditions for base catalyzed removal of carbon (e.g., alkyl and alkyl oxide groups) from flowable organo-silicon films may include a post-deposition cure of the film in an environment that includes water and base vapor. For example, if the base vapor include ammonia as a base catalyst, the deposited film may be heated to about 300° C. while being exposed to a moist ammonia atmosphere at a pressure of about 1 Torr to about 40 Torr for about 2 to about 5 minutes. In additional embodiments, the ammonia atmosphere may also include oxygen ($O_2$) gas, and/or atomic nitrogen (N) generated by the remote plasma dissociation of a nitrogen precursor (e.g., $NH_3$).

Figure 7:
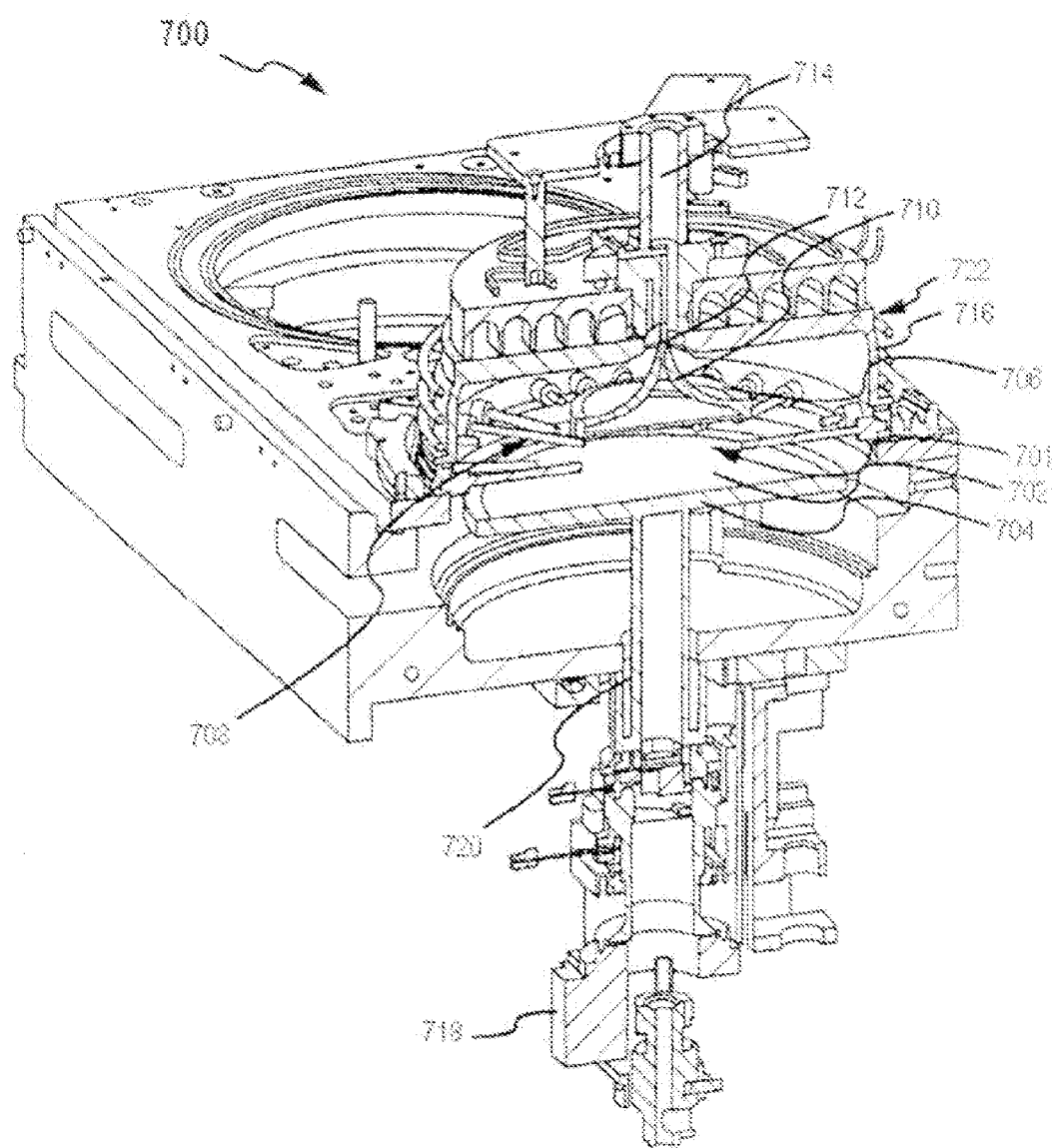
FIG. 7 shows a cross-section of an exemplary process system for forming a silicon oxide film on a substrate according to embodiments of the invention.

Referring now to FIG. 7, a cross-section of an exemplary processing system 700 according to embodiments of the invention is shown. The system 700 includes a deposition chamber 701 where precursors chemically react and deposit a flowable dielectric film on a substrate wafer 702. The wafer 702 (e.g., a 200 mm, 300 mm, 400 mm, etc. diameter semiconductor substrate wafer) may be coupled to a rotatable substrate pedestal 704 that is also vertically translatable to position the substrate 702 closer or further away from the overlying precursor distribution system 706. The pedestal may rotate the substrate wafer at a rotational speed of about 1 rpm to about 2000 rpm (e.g., about 10 rpm to about 120 rpm). The pedestal may vertically translate the substrate a distance from, for example, about 0.5 mm to about 100 mm from the side nozzles 708 of the precursor distribution system.

The precursor distribution system 706 includes a plurality of radially distributed side nozzles 708, each having one of two different lengths. In additional embodiments (not shown) the side nozzles may eliminated to leave a ring of openings distributed around the wall of the deposition chamber. The precursors flow through these openings into the chamber.

The distribution system 706 may also include a conically-shaped top baffle 710 that may be coaxial with the center of the substrate pedestal 704. A fluid channel 712 may run through the center of the baffle 710 to supply a precursor or carrier gas with a different composition than the precursor flowing down the outside directing surface of the baffle.

The outside surface of the baffle 710 may be surrounded by a conduit 714 that directs a reactive precursor from a reactive species generating system (not shown) that is positioned over the deposition chamber 701. The conduit 714 may be a straight circular tube with one end opening on the outside surface of baffle 710 and the opposite end coupled to the reactive species generating system.

The reactive species generating system may be a remote plasma generating system (RPS) that generates the reactive species by exposing a more stable starting material to the plasma. For example, the starting material may be a mixture that includes molecular oxygen (or ozone). The exposure of this starting material to a plasma from the RPS causes a portion of the molecular oxygen to dissociate into atomic oxygen, a highly reactive radical species that will chemically react with an organo-silicon precursor (e.g., TMOS, OMCTS) at lower temperatures (e.g., less than 100° C.) to form a flowable dielectric on the substrate surface. Because the reactive species generated in the reactive species generating system are often highly reactive with other deposition precursors at even room temperature, they may be transported in an isolated gas mixture down conduit 714 and dispersed into the reaction chamber 701 by baffle 710 before being mixed with other deposition precursors.

System 700 may also include RF coils (not shown) coiled around the dome 716 of the deposition chamber 701. These coils can create an inductively-coupled plasma in the deposition chamber 701 to further enhance the reactivity of the reactive species precursor and other precursors to deposit the fluid dielectric film on the substrate. For example, a gas flow containing reactive atomic oxygen dispersed into the chamber by baffle 710 and an organo-silicon precursor from channel 712 and/or one or more of the side nozzles 708 may be directed into a plasma formed above the substrate 702 by the RF coils. The atomic oxygen and organo-silicon precursor rapidly react in the plasma even at low temperature to form a highly flowable dielectric film on the substrate surface.

The substrate surface itself may be rotated by the pedestal 704 to enhance the uniformity of the deposited film. The rotation plane may be parallel to the plane of the wafer deposition surface, or the two planes may be partially out of alignment. When the planes are out of alignment, the rotation of the substrate 704 may create a wobble that can generate fluid turbulence in the space above the deposition surface. In some circumstances, this turbulence may also enhance the uniformity of the dielectric film deposited on the substrate surface. The pedestal 704 may also include recesses and/or other structures that create a vacuum chuck to hold the wafer in position on the pedestal as it moves. Typical deposition pressures in the chamber range from about 0.05 Torr to about 200 Torr total chamber pressure (e.g., 1 Torr), which makes a vacuum chuck feasible for holding the wafer in position.

Pedestal rotation may be actuated by a motor 718 positioned below the deposition chamber 701 and rotationally coupled to a shaft 720 that supports the pedestal 704. The shaft 720 may also include internal channels (not shown) that carry cooling fluids and/or electrical wires from cooling/heating systems below the deposition chamber (not shown) to the pedestal 704. These channels may extend from the center to the periphery of the pedestal to provide uniform cooling and/or heating to the overlying substrate wafer 702. They also may be designed to operate when the shaft 720 and substrate pedestal 704 are rotating and/or translating. For example, a cooling system may operate to keep the substrate wafer 702 temperature less than 100° C. during the deposition of a flowable oxide film while the pedestal is rotating.

The system 700 may further include an irradiation system 722 positioned above the dome 716. Lamps (not shown) from the irradiation system 722 may irradiate the underlying substrate 702 to bake or anneal a deposited film on the substrate. The lamps may also be activated during the deposition to enhance a reaction in the film precursors or deposited film. At least the top portion of the dome 716 is made from a translucent material capable of transmitting a portion of the light emitted from the lamps.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

As used herein and in the appended claims, the singular forms "a", "and", and "the" include plural referents unless the context clearly dictates otherwise. Thus, for example, reference to "a process" may include a plurality of such processes and reference to "the nozzle" may include reference to one or more nozzles and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, or groups.

What is claimed is:

1. A method of depositing a flowable silicon-and-nitrogen containing film on a substrate, the method comprising:
introducing a silicon-containing precursor to a deposition chamber that contains the substrate, wherein the silicon-containing precursor is one of a carbon-free, silicon-and-nitrogen-containing precursor comprising:

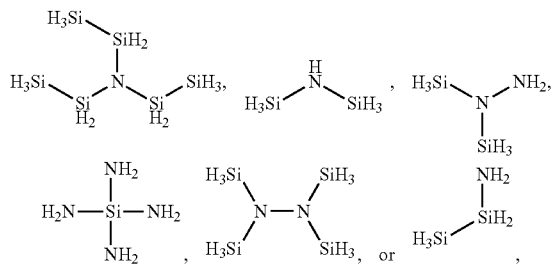

or a cyclic silicon-and-nitrogen-containing precursor comprising:

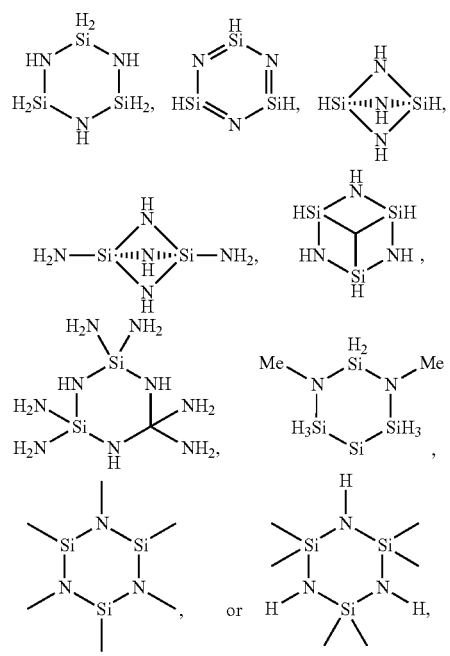

or a carbon-containing silicon precursor comprising:

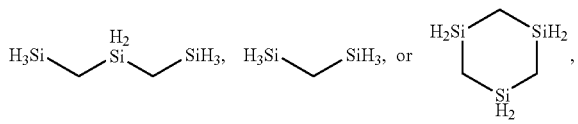

or a Si-Si bond containing precursor comprising:

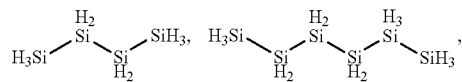

-continued

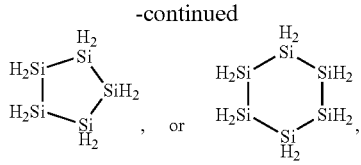

or a silicon-containing precursor comprising:

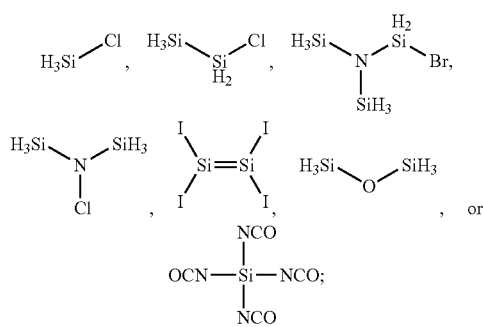

generating at least one radical nitrogen precursor with a remote plasma system located outside the deposition chamber; and introducing the radical nitrogen precursor to the deposition chamber, wherein the radical nitrogen and silicon-containing precursors react and deposit the silicon and nitrogen containing film on the substrate.

2. The method of claim 1, wherein the generation of the atomic nitrogen comprises exposing ammonia to a plasma in the remote plasma system, wherein at least a portion of the ammonia decomposes into the radical nitrogen precursor.

3. The method of claim 1, wherein the radical nitrogen precursor has the formula $NH_x$, where x is 0, 1 or 2.

4. The method of claim 1, wherein the silicon and nitrogen containing film comprises a silicon carbonitride film.

5. The method of claim 1, wherein the silicon and nitrogen containing film comprises a Si—N(H)—Si bond containing film.

6. The method of claim 1, wherein the method further comprises annealing the silicon and nitrogen containing film to form a silicon oxide film.

7. The method of claim 6, wherein the annealing is performed in an atmosphere comprising steam.

8. The method of claim 1, wherein a temperature for the deposition of the silicon and nitrogen containing film on the substrate is about 0° C. to about 400° C.

9. The method of claim 1, wherein a temperature for the deposition of the silicon and nitrogen containing film on the substrate is about 0° C. to about 200° C.

* * * * *